(12) United States Patent
Lu et al.

(10) Patent No.: US 9,229,326 B2
(45) Date of Patent: Jan. 5, 2016

(54) METHOD FOR INTEGRATED CIRCUIT PATTERNING

(71) Applicant: Taiwan Semiconductor Manufacturing Company, Ltd., Hsin-Chu (TW)

(72) Inventors: Yen-Cheng Lu, New Taipei (TW); Shu-Hao Chang, Taipei (TW); Shinn-Sheng Yu, Hsinchu (TW); Jui-Ching Wu, Hsinchu (TW); Jeng-Horng Chen, Hsinchu (TW); Anthony Yen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/212,708

(22) Filed: Mar. 14, 2014

(65) Prior Publication Data

US 2015/0262836 A1 Sep. 17, 2015

(51) Int. Cl.
*G03F 7/20* (2006.01)
*H01L 21/311* (2006.01)
*H01L 21/268* (2006.01)

(52) U.S. Cl.
CPC ............... *G03F 7/20* (2013.01); *H01L 21/268* (2013.01); *H01L 21/31138* (2013.01); *H01L 21/31144* (2013.01)

(58) Field of Classification Search
CPC .................................. G03F 7/20; G03F 7/2051
See application file for complete search history.

(56) References Cited

U.S. PATENT DOCUMENTS

2011/0108815 A1* 5/2011 Kummell et al. ............... 257/40
2014/0131743 A1* 5/2014 Jiang et al. ...................... 257/88

OTHER PUBLICATIONS

Hideo Hada et al., "Chemically Amplified Negative-Tone Resist Using Novel Acryl Polymer for 193nm Lithography," SPIE vol. 3678, 0277-786X, (1999), 8 pages, Part of the SPIE Conference on Advances in Resist Technology and Processing XVI, Santa Clara, California.

* cited by examiner

*Primary Examiner* — Kathleen Duda
(74) *Attorney, Agent, or Firm* — Haynes and Boone, LLP

(57) ABSTRACT

Provided is a method of forming a pattern for an integrated circuit. The method includes forming a first layer over a substrate, wherein the first layer's etch rate is sensitive to a radiation, such as an extreme ultraviolet (EUV) radiation or an electron beam (e-beam). The method further includes forming a resist layer over the first layer and exposing the resist layer to the radiation for patterning. During the exposure, various portions of the first layer change their etch rate in response to an energy dose of the radiation received therein. The method further includes developing the resist layer, etching the first layer, and etching the substrate to form a pattern. The radiation-sensitivity of the first layer serves to reduce critical dimension variance of the pattern.

20 Claims, 7 Drawing Sheets

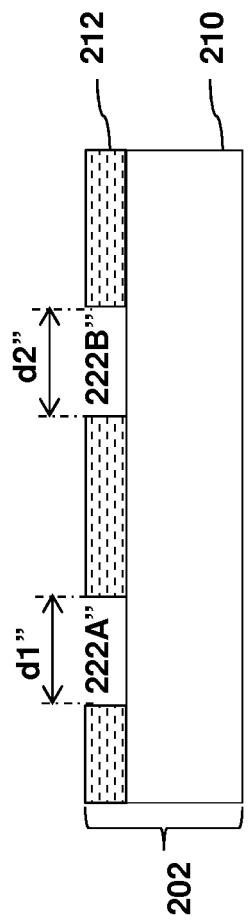

METHOD FOR INTEGRATED CIRCUIT PATTERNING

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, lithography is a technique frequently used in IC manufacturing for transferring an IC design to a semiconductor substrate. A typical lithography includes: coating a resist (or photoresist) layer over a substrate; using a mask, exposing the resist layer; developing the resist layer to leave a patterned resist layer over the substrate; and etching the substrate to form a patterned image. One quality measure of the lithography process is the etched images' critical dimension (CD) uniformity, which directly impacts the IC production yield. As the semiconductor process continues to scale down, it is generally desirable to improve the CD uniformity of after-etch images.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A-2G are cross sectional views of forming a target pattern according to the method of FIG. 1, in accordance with an embodiment.

DETAILED DESCRIPTION

Figure 1:
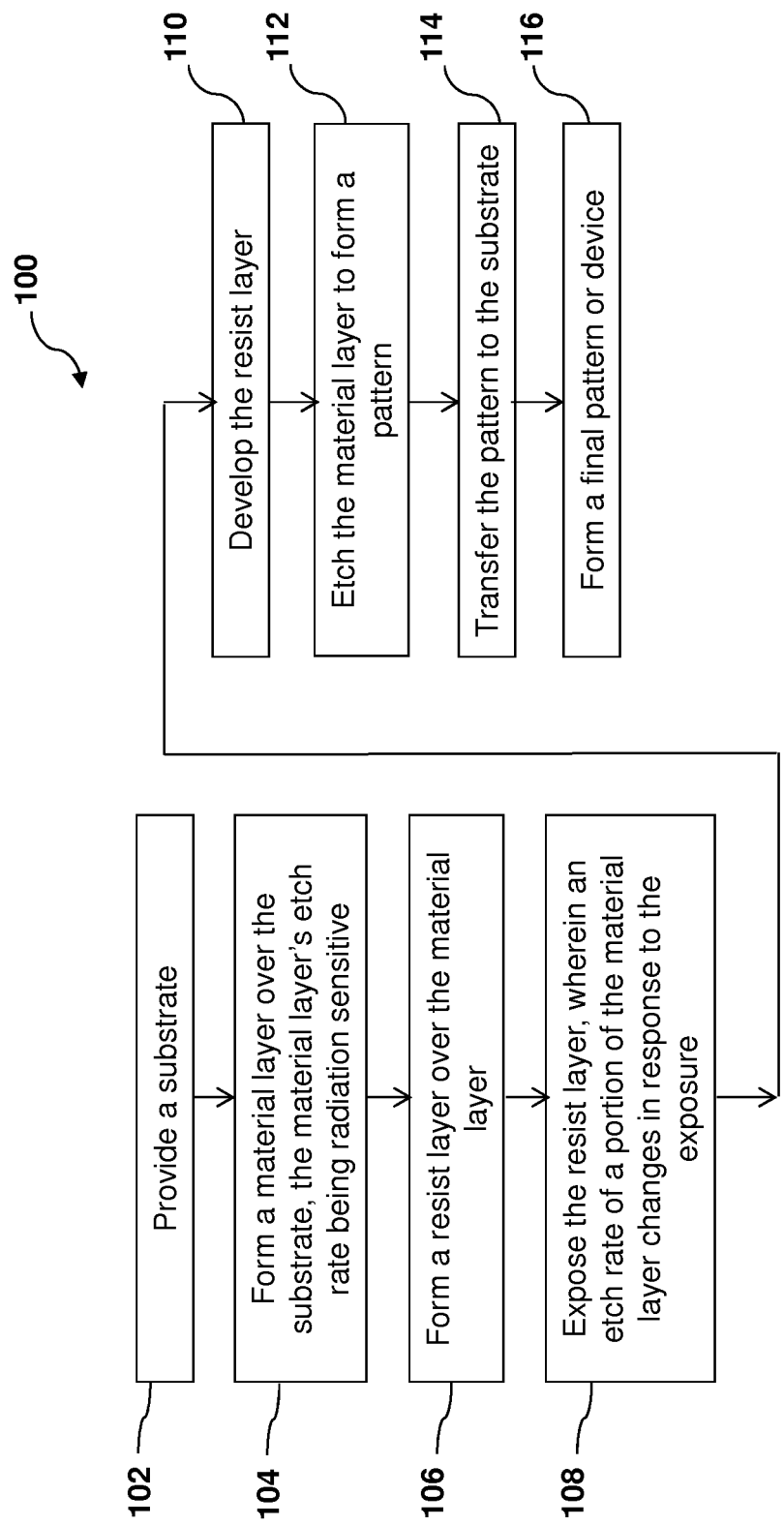
FIG. 1 is a flow chart of a method of forming a target pattern or device on a substrate according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to lithography process when forming a semiconductor device. As semiconductor technology progresses to smaller geometries, such as 45 nm, 20 nm, or even smaller regimes, there is a demand for increased CD uniformity among finished semiconductor devices. A higher CD uniformity means the semiconductor devices will possess a higher consistency in their finished geometries, which has become increasingly critical for nanoscale devices.

A number of factors may contribute to poor CD uniformity. For example, in a lithography process using a scanner, a mask (or photomark or reticle) is aligned to a portion of a wafer which has been coated with a resist layer, and the wafer is exposed to a radiation, such as an extreme ultraviolet (EUV) ray, to form an image of the mask in the resist layer. Afterwards, the mask is aligned to a different portion of the wafer and the wafer is exposed again to form another image in the resist layer. The scanner's radiation energy may vary from one exposure to another, contributing to variance in the dimensions of the exposed images. Furthermore, in some instances, a mask may include multiple copies of the same IC design pattern for increased exposure throughput. However, mask fabrication is not perfect and the multiple copies may exhibit variance in their dimensions, which further contributes to the variance of the exposed images. When the exposed images are transferred from the resist layer to the wafer through a process, such as etching, the variance is typically carried over to the etched images, resulting in poor CD uniformity of the finished semiconductor devices.

Tightening a scanner's exposure energy latitude (EL) and/or tightening mask fabrication process can improve CD uniformity of the etched images. However, in some instances, this may be cost prohibitive. Some embodiments of the provided subject matter aim to improve the CD uniformity of the etched images in a cost effective way. Furthermore, some embodiments of the provided subject matter can be integrated with existing lithography process and/or be combined with other CD uniformity enhancement techniques.

Referring now to FIG. 1, a flow chart of a method 100 for forming a target pattern or device according to various aspects of the present disclosure is illustrated. Additional operations can be provided before, during, and after the method 100, and some operations described can be replaced, eliminated, or moved around for additional embodiments of the method 100. The method 100 is an example, and is not intended to limit the present disclosure beyond what is explicitly recited in the claims. The method 100 will be further described below in conjunction with FIGS. 2A-2G and FIGS. 3A-3D.

Figure 2A:
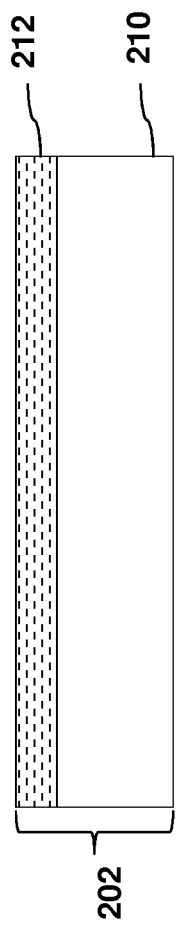

The method 100 (FIG. 1) receives a substrate 202 at operation 102. Referring to FIG. 2A, the substrate 202 includes one or more layers of material or composition. In an embodiment, the substrate 202 is a semiconductor substrate (e.g., wafer). In an embodiment, the substrate 202 includes silicon in a crystalline structure. In alternative embodiments, the substrate 202 includes other elementary semiconductors such as germanium, or a compound semiconductor such as silicon carbide, gallium arsenide, indium arsenide, and indium phosphide. The substrate 202 may include a silicon on insulator (SOI) substrate, be strained/stressed for performance enhancement, include epitaxial regions, include isolation regions, include doped regions, include one or more semiconductor devices or portions thereof, include conductive and/or non-conductive layers, and/or include other suitable features and layers. In the present embodiment as shown in FIG. 2A, the substrate 202 includes a hard mask layer 212 for patterning layer(s) 210 thereunder. In an embodiment, the hard mask layer 212 uses silicon oxide, silicon oxygen carbide, plasma enhanced chemical vapor deposited silicon oxide, amorphous silicon (a-Si), silicon nitride (SiN), titanium nitride, or other suitable material or composition. The hard mask layer 212 may be formed by a variety of processes. For example, the hard mask layer 212 may include silicon oxide formed by thermal oxidation. In an embodiment, the hard mask layer 212 includes SiN formed by chemical vapor deposition (CVD). For example, the hard mask layer 212 may be formed by CVD using chemicals including Hexachlorodisilane (HCD or $Si_2Cl_6$), Dichlorosilane (DCS or $SiH_2Cl_2$), Bis(TertiaryButylAmino) Silane (BTBAS or $C_8H_{22}N_2Si$) and Disilane (DS or $Si_2H_6$).

Figure 2B:
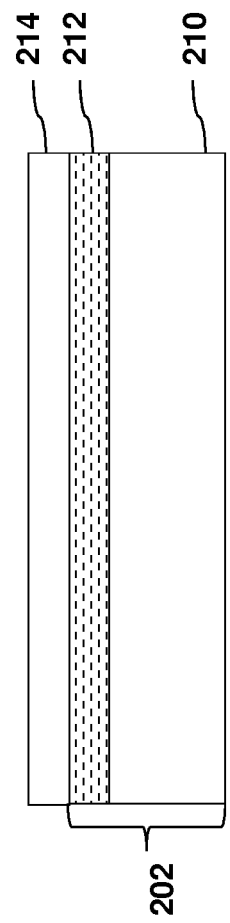

The method 100 (FIG. 1) proceeds to operation 104 to form a radiation-sensitive material layer 214 over the substrate 202. Referring to FIG. 2B, shown therein is the material layer 214 formed over the hard mask layer 212. In some embodiments, additional layer(s) (not shown) may be formed between the hard mask layer 212 and the material layer 214, such as an anti-reflection coating (ARC) layer, or a nitrogen-free anti-reflection coating (NFARC) layer. In the present embodiment, the material layer 214 includes a radiation-sensitive material whose etch rate decreases (i.e., becoming harder to etch) in response to an increased radiation energy that it receives. An exemplary radiation-sensitive material is a polymer which forms intra-molecular and/or intermolecular cross links when irradiated, such as a negative photoresist. One such exemplary polymer is a polymerization of Ethyl(α-hydroxy)acrylate (EHMA) and methacryl acid (MAA), EHMAm-MAAn, such as EHMA80-MAA20, as disclosed in Hideo Hada et al. "Chemically Amplified Negative-Tone Resist Using Novel Acryl Polymer for 193 nm Lithography." *SPIE Conference on Advances in Resist Technology and Proceeding XVI* (1999) ("Hada"). The material layer 214 may further include a crosslinker, such as BMU, BMEU, TMGU, or TBGU, as disclosed in Hada. The material layer 214 may further include photoacid generators (PAG). The material layer 214 may be formed by a variety of processes. In an embodiment, the material layer 214 is formed by a spin coating process. Other suitable process, such as deposition, may alternatively be used.

Figure 2C:
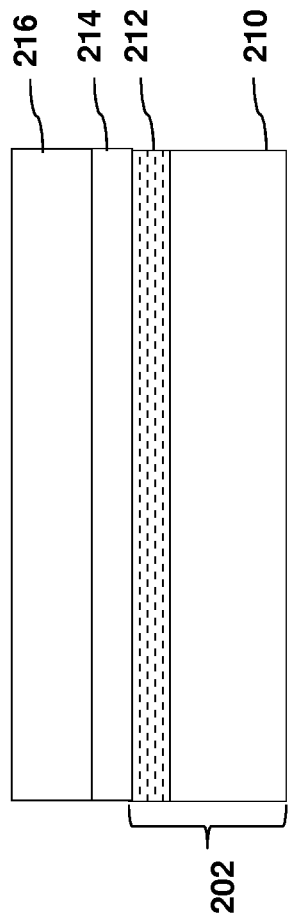

The method 100 (FIG. 1) proceeds to operation 106 by forming a resist layer 216 over the material layer 214. Referring to FIG. 2C, in the present embodiment, the resist layer 216 is a positive resist. A positive resist is normally insoluble in a resist developer, but is made soluble by exposure to a radiation. In an embodiment, the resist layer 216 is formed by a process including a resist coating process followed by a soft baking process.

Figure 2D:
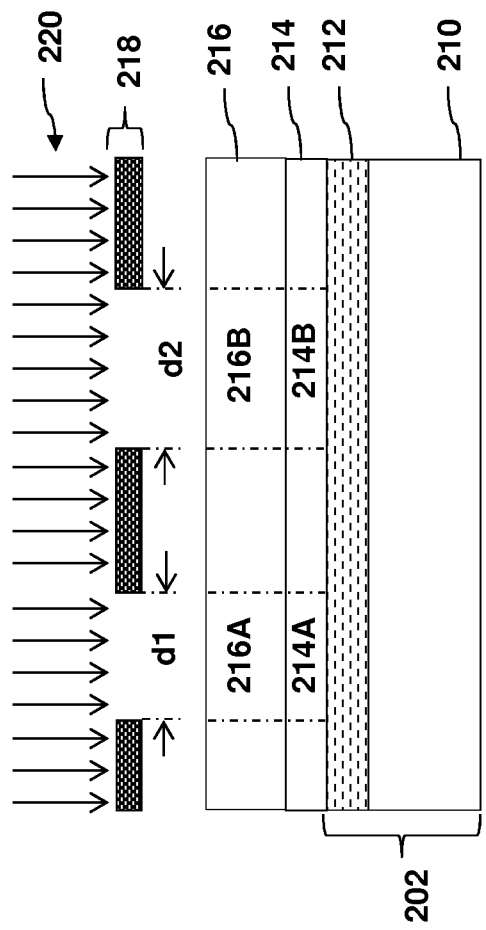

The method 100 (FIG. 1) proceeds to operation 108 by exposing the resist layer 216 for patterning thereof. Referring to FIG. 2D, illustrated therein is the resist layer 216 being patterned by a radiation 220 using a mask 218. In an embodiment, the mask 218 is a transmissive mask with transparent regions and opaque regions. The radiation 220, such as a deep ultraviolet (DUV) ray, passes through the transparent regions and irradiates various portions of the resist layer 216, such as portions 216A and 216B. In another embodiment, the radiation 220 is a EUV ray and the mask 218 is a reflective mask. For example, EUV lithography typically uses a radiation source having a wavelength below about 100 nm, such as a wavelength of about 13.5 nm or less. In such a case, the mask 218 is a reflective mask that includes tens of alternating layers of silicon and molybdenum deposited on a substrate to act as a Bragg reflector that maximizes the reflection of a EUV ray incident thereon. In yet another embodiment, maskless lithography, such as electron beam (e-beam) lithography, may be used by operation 108. For the purposes of illustrating the present disclosure, it suffices to say that the two portions, 216A and 216B, are exposed to the radiation 220 which can be a DUV ray, a EUV ray, an e-beam, an x-ray, an ion beam, or other suitable radiation, and which is patterned by an IC design layout or a mask. Furthermore, the two portions, 216A and 216B, may be exposed simultaneously or at different times, such as by different exposures (shots) in a lithographic scanner (or stepper). To further illustrate the provided subject matter, the two portions, 216A and 216B, are supposed to have the same dimensions from an IC design layout perspective. However, due to mask fabrication inaccuracies and/or exposure dosage variations, the two portions 216A and 216B now have different dimensions d1 and d2 respectively (FIG. 2D). In the present embodiment, d1 is less than d2 for the sake of illustration. In a traditional lithography process, the difference between d1 and d2 will typically be carried over to finished patterns in the substrate 202. However, in the present embodiment, the presence of the material layer 214 helps reduce the difference between the finished patterns, as will be discussed below.

FIG. 2D further illustrates that two portions of the material layer 214, 214A and 214B, are also irradiated when the portions 216A and 216B are exposed, respectively. One reason is that a portion of the radiation 220, such as highly energized photons or electrons, penetrates the resist layer 216 and irradiates the first layer 214. Due to the radiation-sensitivity of the material layer 214, the two portions 214A and 214B now possess increased etch resistance (or decreased etch rate) compared with other portions of the first layer 214 not irradiated by the radiation 220. Furthermore, because the portion 216B has a greater dimension than the portion 216A (d2>d1), more radiation energy reaches and is absorbed by the portion 214B than the portion 214A, resulting in the portion 214B having a higher etch resistance than the portion 214A.

Figure 2E:
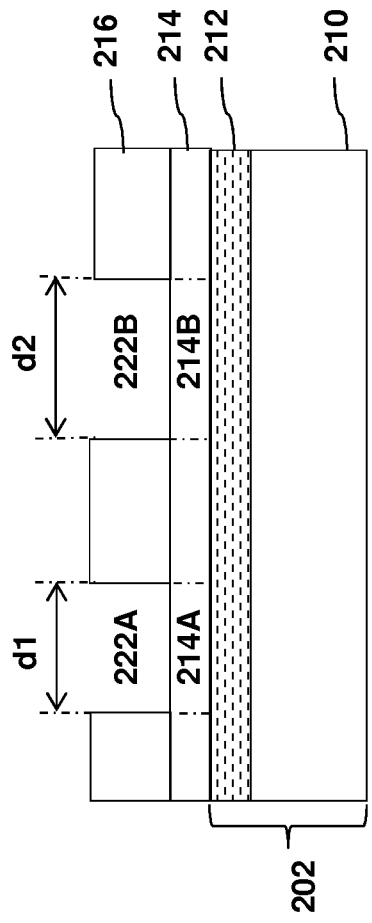

The method 100 (FIG. 1) proceeds to operation 110 by developing the resist layer 216 thereby forming a patterned resist layer 216. Referring to FIG. 2E, the resist layer 216 is developed and partially stripped thereby forming a pattern in the resist layer 216 in the form of two openings, 222A and 222B. In an embodiment, the resist layer 216 may be baked (post exposure baking) before being developed. In some embodiments, the resist layer 216 is developed by applying a water based developer, such as tetramethylammonium hydroxide (TMAH). Applying a developer may include spraying the developer on the exposed resist layer 216, for example, by a spin-on process. In an embodiment, a post develop bake (PDB) process is further applied to the developed resist layer 216.

Figure 2F:
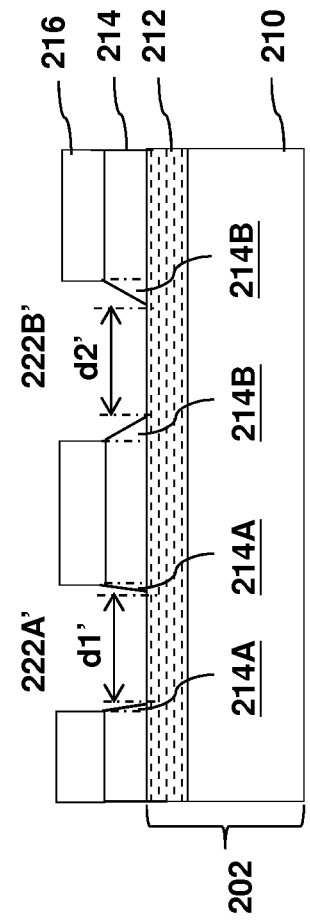

The method 100 (FIG. 1) proceeds to operation 112 by etching the material layer 214 thereby forming a patterned material layer 214. Referring to FIG. 2F, the material layer 214 is etched with the patterned resist layer 216 as an etch mask thereby forming two openings, 222A' and 222B', in the material layer 214. The patterned resist layer 216 may be partially or completely consumed during this process. The etching process may include a dry (plasma) etching, a wet etching, and/or other etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. In an embodiment, the etching process is an isotropic etching. Because the portion 214A has a lower etch resistance (higher etch rate) than the portion 214B, the opening 222A' has a steeper sidewall(s) than the opening 222B'. Accordingly, near or at a top surface of the hard mask layer 212, the openings 222A' and 222B' have about the same dimensions. As illustrated in FIG. 2F, d2' is about the same as d1', even though d2 is larger than d1 (FIG. 2E).

The method 100 (FIG. 1) proceeds to operation 114 by etching the substrate 202 with the patterned material layer 214 as an etch mask thereby transferring the openings 222A' and 222B' to the substrate 202. Referring to FIG. 2G, in the present embodiment, the openings 222A' and 222B' are transferred to the hard mask layer 212 of the substrate 202. In an embodiment, this is accomplished by etching the hard mask layer 212 with the patterned material layer 214 and the patterned resist layer 216, if not completely consumed in operation 112, as an etch mask. The etching process may include a dry (plasma) etching, a wet etching, and/or other etching methods. The patterned material layer 214 and the patterned resist layer 216, if any, are subsequently removed, resulting in two openings 222A" and 222B" in the hard mask layer 212. The two openings 222A" and 222B" have dimensions d1" and d2" respectively and the dimension d1" and d2" are about the same, matching the intended IC design pattern(s). As can be appreciated by a person having ordinary skill in the art, even though there may be inaccuracies in the mask fabrication (such as the mask 218) and/or exposure dosage variance in the radiation 220 (FIG. 2D), the presence of the material layer 214 in the present embodiment helps reduce dimension variance in the after-etching images 222A" and 222B".

The method 200 (FIG. 2) proceeds to operation 116 to form a final pattern or device with the patterned hard mask layer 212. In an embodiment, a target pattern is to be formed as metal lines in a multilayer interconnection structure. For example, the metal lines may be formed in an inter-layer dielectric (ILD) layer. In such a case, the operation 116 forms a plurality of trenches in the ILD layer using the patterned hard mask layer 212; fills the trenches with a conductive material, such as a metal; and polishes the conductive material using a process such as chemical mechanical polishing to expose the patterned ILD layer, thereby forming the metal lines in the ILD layer.

In another embodiment, the operation 116 forms contacts on a semiconductor substrate using the patterned hard mask layer 212 and the contacts provide interconnection to one or more of the interconnect layers of a multilayer interconnect. In this embodiment, the operation 116 forms a plurality of trenches in an ILD layer of the semiconductor substrate and fills the trenches with a conductive material to form vias. The conductive material may include tungsten or other suitable conductive element. In an embodiment, the contacts provide electrical connection to source/drain regions and/or gate structures in the semiconductor substrate.

In yet another embodiment, the operation 116 forms fin field effect transistor (FinFET) structures on a semiconductor substrate using the patterned hard mask layer 212. In this embodiment, the operation 116 forms a plurality of trenches in the semiconductor substrate. Shallow trench isolation (STI) features are further formed in the trenches by a procedure that includes deposition to fill the trenches with a dielectric material and polishing (such as CMP) to remove excessive dielectric material and to planarize the top surface of the semiconductor substrate. Thereafter, a selective etch process is applied to the dielectric material to recess the STI features, thereby forming fin-like active regions.

FIG. 3A-3D illustrate sectional views of forming a target pattern according to the method 100 of FIG. 1, in accordance with another embodiment where negative resist is used in the lithography process. FIG. 3A-3D are discussed below in conjunction with the various operations of the method 100.

Figure 3A:
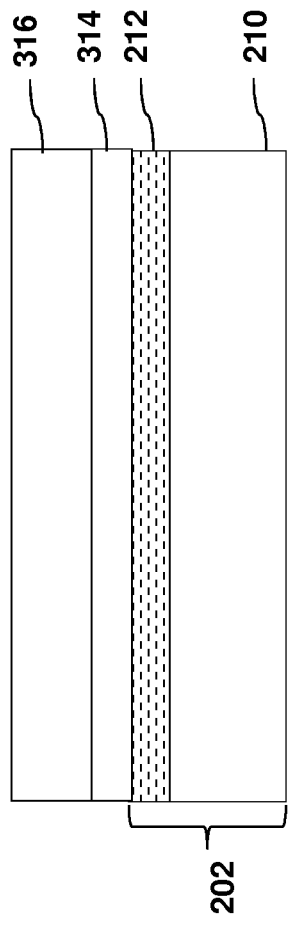
FIGS. 3A-3D are cross sectional views of forming a target pattern according to the method of FIG. 1, in accordance with an embodiment.

FIG. 3A shows that, by the operations 102, 104, and 106 of the method 100 (FIG. 1), a material layer 314 is formed over the hard mask layer 212 of the substrate 202 and a negative resist layer 316 is formed over the material layer 314. In some embodiments, additional layer(s) (not shown) may be formed between the hard mask layer 212 and the material layer 314, such as an anti-reflection coating (ARC) layer, or a nitrogen-free anti-reflection coating (NFARC) layer. In the present embodiment, the material layer 314 includes a radiation-sensitive material whose etch rate increases (i.e., becoming easier to etch) in response to an increased radiation energy that it receives. In an embodiment, the material layer 314 includes a two-dimensional (2D) polymer whose chemical bonds break when irradiated. An exemplary material is poly (methyl methacrylate) (PMMA). The material layer 314 may be formed by a variety of processes. In an embodiment, the material layer 314 is formed by a spin coating process. Other suitable process, such as deposition, may alternatively be used. The negative resist layer 316 is formed by a process including a resist coating process followed by a soft baking process.

Figure 3B:
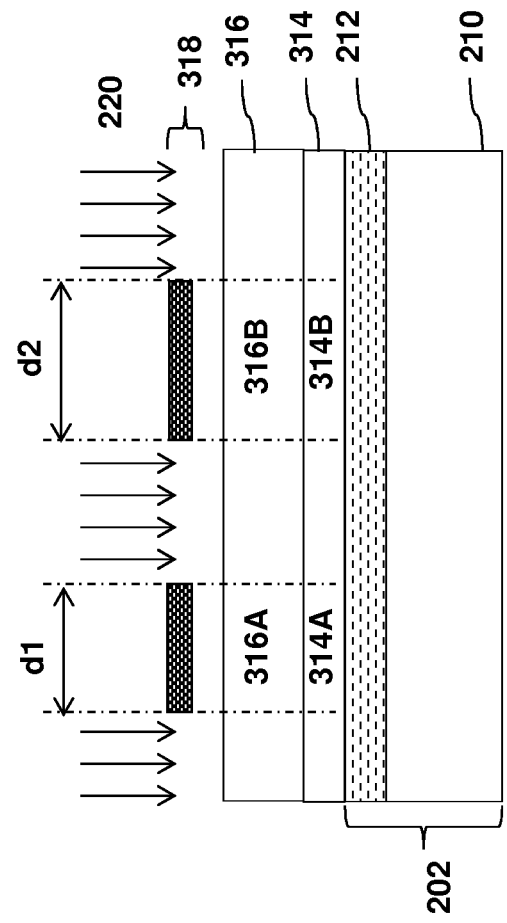

FIG. 3B shows that, by the operation 108 of the method 100 (FIG. 1), the negative resist layer 316 is exposed to the radiation 220. FIG. 3B further shows that a negative mask 318 is used for patterning the negative resist layer 316. A negative resist is normally soluble in a resist developer, but is made insoluble by exposure to a radiation, such as the radiation 220. In the present embodiment, various portions of the negative resist layer 316, such as portions 316A and 316B, remain soluble in a resist developer after the exposing process and will be developed for patterning the negative resist layer 316. However, the portions 316A and 316B are not completely isolated from surrounding radiations and some portion of the radiation 220 will reach the portions 316A and 316B as well as portions 314A and 314B of the material layer 314 that are underneath the portions 316A and 316B respectively. The effect of this radiation has at least two aspects. On the one hand, as long as the portions 316A and 316B do not receive so much radiation as to cross an insolubility threshold, they remain soluble in a resist developer. On the other hand, the portions 314A and 314B increase their respective etch rate in response to an energy dose of the radiation received thereof. For the sake of illustrating the provided subject matter, the portions 316A and 316B are supposed to have the same dimensions from an IC design layout perspective, but now have different dimensions due to inaccuracies in the mask 318 or exposure dose variance in the radiation 220. As illustrated in FIG. 3B, the portions 316A and 316B have dimensions d1 and d2 respectively, where d1 is less than d2. Accordingly, the portion 314A receives more radiation energy from surrounding areas than the portion 314B does because, illustratively, the portions 316A/314A are covered by a relatively smaller opaque mask region of the mask 318. As a result, the portion 314A has a higher etch rate (i.e., easier to etch) than the portion 314B. In an embodiment, the mask 318 is a transmissive mask. In another embodiment, the mask 318 is a reflective mask.

Figure 3C:
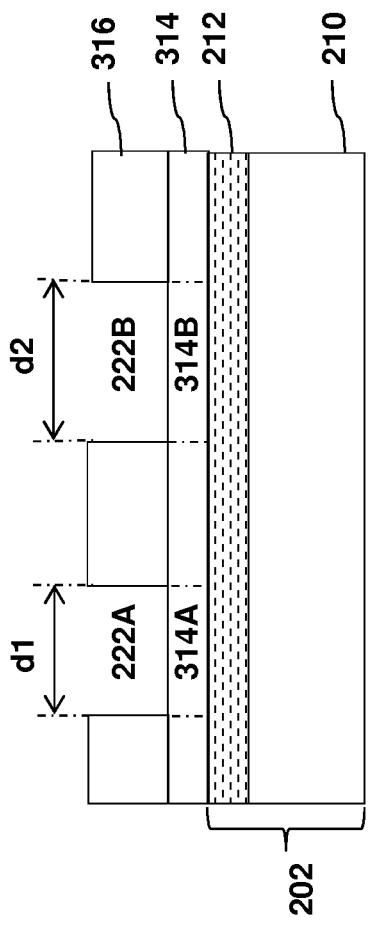

FIG. 3C shows that, by the operation 110 of the method 100 (FIG. 1), the negative resist layer 316 is developed and the portions 316A and 316B are removed thereby forming two openings 222A and 222B. In an embodiment, the process of developing the negative resist layer 316 is similar to that used for developing the positive resist layer 216 except with a developer suitable for the negative resist layer 316.

Figure 3D:
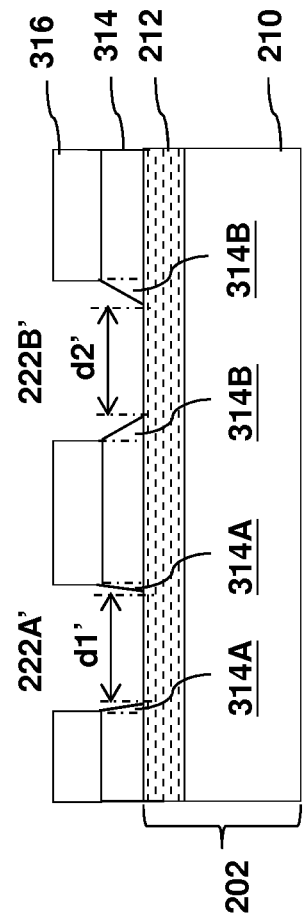

FIG. 3D shows that, by the operation 112 of the method 100 (FIG. 1), the material layer 314 is etched with the developed negative resist layer 316 as an etch mask thereby forming two openings 222A' and 222B'. The etching process may be similar to that discussed with reference to FIG. 2F. Further steps may be performed, such as the operations 114 and 116 of the method 100 (FIG. 1), to transfer the patterns 222A' and 222B' to the hard mask layer 212, and to form a final pattern or device in the substrate 202. Such operations are similar to those discussed above with reference to FIG. 2G and are not repeated for purposes of brevity.

The present disclosure provides many benefits. Although not intended to be limiting, some benefits are discussed below. For example, some embodiments of the present disclosure improve critical dimension uniformity of after-etching images. This can directly improve semiconductor production yield, particularly in nano-scale regimes. For example, some embodiments of the present disclosure provide a cost effective way of improving lithography process stability even in the presence of mask fabrication inaccuracies and exposure dosage variances. For example, some embodiments of the present disclosure can be readily integrated into many existing lithography processes. For example, some embodiments of the present disclosure are particularly useful when forming a layer of contact holes (e.g., vias) because such features are designed to have uniform dimensions with respect to each other.

In one exemplary aspect, the present disclosure is directed to a method of forming a pattern for an integrated circuit (IC). The method includes forming a first material layer over a substrate, wherein the first material layer's etch rate is radiation-sensitive. The method further includes forming a resist layer over the first material layer and exposing the resist layer to a radiation for patterning the resist layer, wherein the radiation reaches the first material layer and at least a portion of the first material layer changes its etch rate in response to an energy dose of the radiation that it receives. The method further includes developing the resist layer thereby forming a patterned resist layer; and etching the first material layer with the patterned resist layer as an etch mask thereby forming a patterned first material layer.

In another exemplary aspect, the present disclosure is directed to a method of patterning a substrate. The method includes forming a first layer over the substrate, wherein the first layer's etch rate is radiation-sensitive. The method further includes forming a positive resist layer over the first layer and exposing a first portion of the positive resist layer to a radiation, wherein a second portion of the first layer that is underneath the first portion decreases its etch rate during the exposing. The method further includes developing the positive resist layer to remove the first portion; etching the second portion to expose the substrate; and etching the substrate to form a pattern.

In yet another exemplary aspect, the present disclosure is directed to a method of forming a pattern for an integrated circuit (IC). The method includes forming a first layer over a substrate, wherein the first layer has a property that its etch rate increases when an energy dose of a radiation incident thereon increases. The method further includes forming a negative resist layer over the first layer and patterning the negative resist layer thereby forming a patterned resist layer. The method further includes etching the first layer with the patterned resist layer as an etch mask.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a pattern for an integrated circuit (IC), the method comprising:
    forming a first material layer over a substrate, wherein the first material layer has a first etch rate;
    forming a resist layer over the first material layer;
    exposing the resist layer to a radiation for patterning the resist layer, wherein the radiation reaches a first portion and a second portion of the first material layer, resulting in the first portion having a higher etch rate than the second portion;
    developing the resist layer thereby forming a patterned resist layer, wherein the patterned resist layer includes a first opening and a second opening, the first opening exposes the first portion of the first material layer, and the second opening exposes the second portion of the first material layer; and
    etching the first and second portions of the first material layer through the first and second openings, thereby forming a patterned first material layer.

2. The method of claim 1, wherein the substrate includes a hard mask layer over which the first material layer is formed.

3. The method of claim 1, wherein:
    the first portion and the second portion each have a respective etch rate that is less than the first etch rate; and
    the resist layer is a positive resist.

4. The method of claim 1, wherein:
    the first portion and the second portion each have a respective etch rate that is greater than the first etch rate; and
    the resist layer is a negative resist.

5. The method of claim 1, further comprising:
    etching the substrate with the patterned first material layer as an etch mask.

6. The method of claim 1, wherein the forming the first material layer includes a spin on coating process.

7. The method of claim 1, wherein the substrate includes silicon.

8. The method of claim 1, wherein the radiation is one of: a DUV ray, a EUV ray, an e-beam, an x-ray, and an ion beam.

9. The method of claim 1, wherein the etching the first material layer includes a dry etching process.

10. The method of claim 1, wherein the etching the first material layer includes an isotropic etching process.

11. The method of claim 1, wherein the etching of the first and second portions of the first material layer forms third and fourth openings respectively in the first material layer, and wherein the third opening has a steeper sidewall than the fourth opening.

12. The method of claim 1, wherein the first opening has a smaller dimension than the second opening.

13. A method of patterning a substrate, the method comprising the steps of:
    forming a first layer over the substrate, wherein the first layer's etch rate is radiation-sensitive and has a first etch rate;
    forming a positive resist layer over the first layer, wherein first and second portions of the positive resist layer are over first and second portions of the first layer respectively;
    exposing the first and second portions of the positive resist layer to a radiation, wherein an etch rate of each of the first and second portions of the first layer becomes lower than the first etch rate as a result of the exposing, and wherein the first portion of the first layer has a higher etch rate than the second portion of the first layer;
    developing the positive resist layer to remove the first and second portions of the positive resist layer;
    etching the first and second portions of the first layer to expose the substrate; and
    etching the substrate to form a pattern.

14. The method of claim 13, wherein the substrate includes a hard mask layer over which the first layer is formed.

15. The method of claim 14, wherein the hard mask layer includes one of: titanium nitride, silicon nitride, and titanium oxide.

16. The method of claim 13, wherein the radiation has a wavelength less than 100 nanometer (nm).

17. A method of forming a pattern for an integrated circuit (IC), the method comprising:
    forming a first layer over a substrate, wherein the first layer has a property that its etch rate increases when an energy dose of a radiation incident thereon increases;
    forming a negative resist layer over the first layer;
    exposing the negative resist layer to a radiation, wherein the radiation causes first and second portions of the first layer increase their respective etch rates, and wherein the first portion has a higher etch rate than the second portion;
    patterning the negative resist layer thereby forming a patterned resist layer, wherein the patterned resist layer includes first and second openings, and wherein the first and second openings expose the first and second portions respectively; and
    etching the first layer with the patterned resist layer as an etch mask.

18. The method of claim 17, further comprising, before forming the first layer:
    forming an anti-reflection coating layer over the substrate.

19. The method of claim 17, further comprising:
    etching the substrate with the etched first layer as an etch mask.

20. The method of claim 17, wherein the etching of the first layer forms third and fourth openings in the first and second portions respectively, and wherein the third opening has a steeper sidewall than the fourth opening.

* * * * *